US008541776B2

(12) United States Patent
Bandaru et al.

(10) Patent No.: US 8,541,776 B2
(45) Date of Patent: Sep. 24, 2013

(54) NANOSTRUCTURE-BASED MEMORY

(75) Inventors: Prabhakar R. Bandaru, San Diego, CA (US); Joel Hollingsworth, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 1217 days.

(21) Appl. No.: 12/094,850

(22) PCT Filed: Dec. 1, 2006

(86) PCT No.: PCT/US2006/061499
§ 371 (c)(1),
(2), (4) Date: Jan. 13, 2009

(87) PCT Pub. No.: WO2008/054430
PCT Pub. Date: May 8, 2008

(65) Prior Publication Data
US 2009/0175073 A1    Jul. 9, 2009

Related U.S. Application Data

(60) Provisional application No. 60/741,574, filed on Dec. 2, 2005.

(51) Int. Cl.
H01L 35/24        (2006.01)
H01L 51/00        (2006.01)

(52) U.S. Cl.
USPC ................................................................ 257/40

(58) Field of Classification Search
USPC ......................... 257/40, E39.007, E51.006
See application file for complete search history.

(56) References Cited

U.S. PATENT DOCUMENTS

| 2,913,578 | A | * | 11/1959 | Younker ..................... 327/222 |
| 5,714,766 | A | | 2/1998 | Chen et al. |
| 6,034,887 | A | | 3/2000 | Gupta et al. |
| 6,969,651 | B1 | | 11/2005 | Lu et al. |
| 2002/0030646 | A1 | | 3/2002 | Song et al. |
| 2005/0161668 | A1 | * | 7/2005 | Kastalsky et al. ............... 257/46 |
| 2005/0218397 | A1 | | 10/2005 | Tran |

* cited by examiner

Primary Examiner — Cuong Q Nguyen
(74) Attorney, Agent, or Firm — Perkins Coie LLP

(57) ABSTRACT

Improved memory devices that include one or more nanostructures such as carbon nanotubes or other nanostructures, as well as systems and devices incorporating such improved memory devices, are disclosed. In at least some embodiments, the improved memory device is of a nonvolatile type such as a flash memory device, and employs a pair of triodes that form a memory cell, where each triode employs at least one carbon nanotube. Also disclosed are methods of operating and fabricating such improved memory devices.

14 Claims, 3 Drawing Sheets

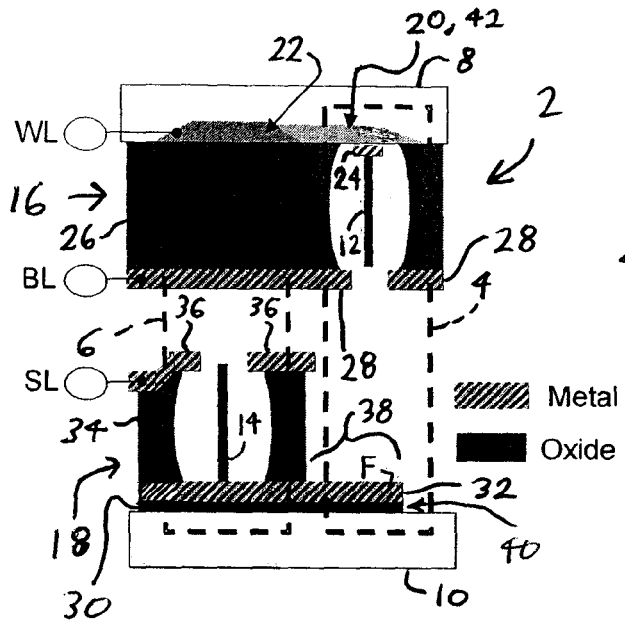
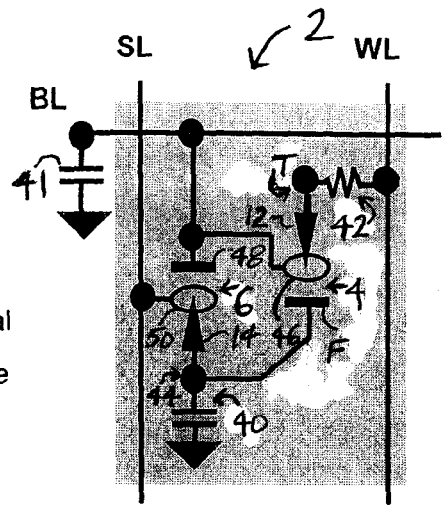
FIG. 1    FIG. 2
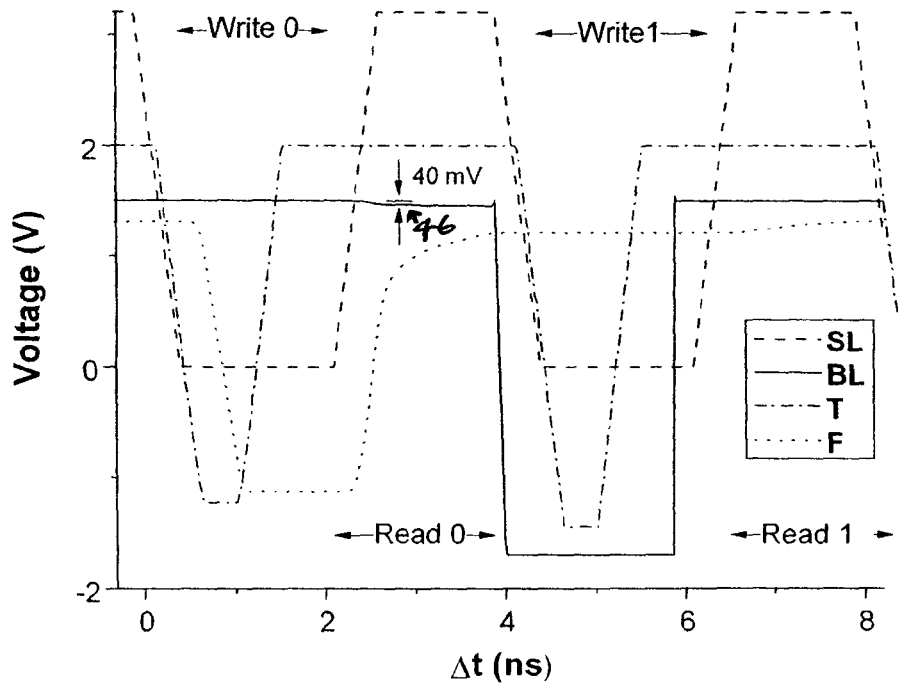
FIG. 3

NANOSTRUCTURE-BASED MEMORY

CROSS-REFERENCE TO RELATED APPLICATIONS

This application claims the benefit of U.S. provisional patent application No. 60/741,574 entitled "Carbon Nanotube Based Nonvolatile Memory" filed on Dec. 2, 2005, which is hereby incorporated by reference herein.

STATEMENT REGARDING FEDERALLY SPONSORED RESEARCH OR DEVELOPMENT

This invention was made with government support under ECS0508514 awarded by National Science Foundation. The government has certain rights in the invention.

FIELD OF THE INVENTION

The present invention relates to memory devices, such as non-volatile memory devices.

BACKGROUND OF THE INVENTION

Memory or storage devices continue to be of great importance in a variety of electrical and computer systems, as well as a variety of other applications. Memory devices can take a variety of forms including, for example, non-volatile memory devices (e.g., flash memory devices, ROM, PROM, EPROM, EEPROM, etc.) and volatile memory devices (e.g., random access memory or RAM, DRAM, SRAM, SDRAM, etc.).

Although many useful memory/storage devices already exist, the evolution of a variety of technologies (including, for example, computer technologies) continues to drive a need for improved memory/storage devices that are improved on a number of counts. First, there continues to be a need for memory/storage devices capable of storing ever-greater amounts of data and information. At the same time, there also continues to be a need for memory or storage devices that are of increasingly small size, and so there continues to be a need for memory/storage devices with higher packing densities.

In addition to the needs for ever smaller memory/storage devices having ever greater data storage capabilities, there also continues to be a need for memory/storage devices that are capable of storing (and allowing for the retrieval) of stored data at increasingly rapid rates. Further, there continues to be a need for memory/storage devices that are capable of operating using reduced amounts of power, and that are capable of operating with less heat dissipation.

Existing state of the art non-volatile memory technology (for example, flash memory devices employing field effect transistor technologies) faces enormous obstacles in further scaling down. For example, planar flash memory technology based on silicon field effect transistors faces obstacles to further miniaturization. Scaling of the tunneling oxide used in these memory cells is complicated by the incompatible requirements of high programming current and minimal leakage current—that is, miniaturization results in incompatible requirements of high programming current and low leakage currents. As devices are scaled down/made smaller, increased current density or increased programming currents/unit area are necessary to write information onto the devices. However, increased current results in an increased possibility for the current to leak (leakage currents), which means higher static power dissipation which is undesirable, again. Further, the increased voltage needed for hot electron injection is an additional problem. This is a problem particularly during the programming part of the flash memory operation Indeed, while the basic tunneling mechanism used in flash memory is useful and attractive, it is widely recognized that alternative materials and new device architectures are needed in order to achieve further advances in non-volatile memory (see, for example, the discussion provided in "Flash Memory Scaling", Emerging Solid State Memory Technologies, MRS Bulletin, Volume 29, November, 2004, which is hereby incorporated by reference herein).

It would therefore be advantageous if improved memory devices and or methods of operating memory devices were developed, and/or new technologies were developed for fabricating such improved memory devices. It would further be advantageous if, in at least some embodiments, such improved memory devices had greater memory capacity, took on a smaller size, and/or had greater packing densities than conventional memory devices. It would additionally be advantageous if, in at least some embodiments, such improved memory devices could operate at greater speeds, with less power and heat dissipation, than conventional memory devices. Such advantages would be desirable in a variety of different types of memory devices including, for example, flash memory devices.

BRIEF SUMMARY OF THE INVENTION

The present inventors have recognized the need for improved memory or storage devices having one or more of greater storage capacity, improved rapidity of operation, and/or smaller size. The present inventors further have recognized that an improved memory device can be developed through the use of a memory device formed utilizing one or more nanostructures, for example, carbon-based nanostructures such as carbon nanotubes (CNTs), carbon nanocones, carbon nanowires and/or carbon nanofibers. In at least some embodiments, such a memory device circumvents the issues of transistor scaling and hot electron effects that limit conventional memory devices, and makes use of the enhanced field emission that can be obtained from such nanostructures. Also, in at least some embodiments of the present invention, salient features of flash memory technology (such as electron tunneling) are retained and, at the same time, the inherent advantages of enhanced field emission from the atomic sized tips of carbon based nanostructures are exploited. Thus, such embodiments advantageously apply nanoscience technologies to the construction of memory devices such as flash memory devices.

Further, in at least some embodiments of the present invention, the improved memory devices provide advantages such as lower power levels due to the higher efficiency of field emission from nanostructures, greater circuit density, faster speeds of operation as the electrons travel in vacuum, greater reliability due to the absence of tunneling through oxide, and immunity to ionizing radiation. There is an added advantage, in at least some embodiments, in that there is no longer any need for active transistors to be used. Also, in at least some embodiments, higher device speeds and larger current drives are also ensured by operation in vacuum. Further, in at least some embodiments, carbon morphologies are also susceptible to nano-engineering of their geometry, through growth and in situ modification, and offer the possibility of varying device characteristics individually, which is again not possible in conventional devices.

The present invention in at least some embodiments relates to a memory device that includes a first nanostructure that is a nanotube, a nanowire, a nanocone, or a nanofiber. In at least some further embodiments, the nanostructure is a carbon nanotube, or the first nanostructure is positioned within a vacuum-sealed region. In at least some additional embodiments, more than one nanotube/nanowire/nanocone/nanofiber are employed.

Additionally, in at least some embodiments, the present invention relates to a memory cell that includes first and second substrates, and first and second metallic layers supported in relation to the first and second substrates, where the first and second metallic layers each are positioned in between the first and second substrates. Further, the memory cell includes first and second carbon nanostructures extending away from the first and second substrates, respectively, toward the first and second metallic layers, respectively.

Further, in at least some embodiments, the present invention relates to a method of operating a memory device. The method includes applying a first voltage to a first port of a first triode comprising a first carbon nanostructure, and emitting electrons from the carbon nanostructure toward a second port of the triode. Additionally, in at least some embodiments, the present invention relates to a method of manufacturing a memory device that includes forming a carbon nanostructure as part of a triode for use in the memory device.

BRIEF DESCRIPTION OF THE DRAWINGS

FIG. 1 is a schematic cross-sectional view of an exemplary memory device employing a pair of memory cells each with a carbon nanotube, in accordance with at least one embodiment of the present invention;

FIG. 2 is a schematic circuit diagram showing circuit components formed within the exemplary memory device of FIG. 1;

FIG. 3 is a timing diagram showing exemplary time variation of several voltage levels associated with the memory device of FIG. 1;

DETAILED DESCRIPTION OF THE PREFERRED EMBODIMENT

Figure 6:
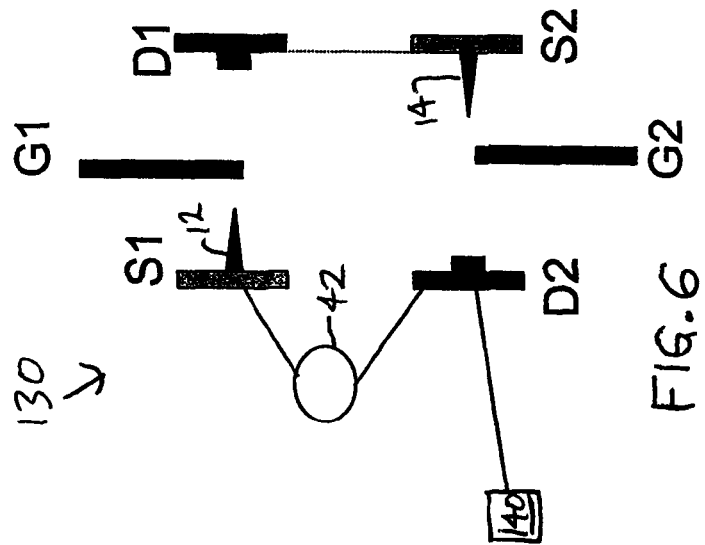
FIG. 6 is a schematic diagram illustrating an exemplary circuit that can make use of the exemplary memory device of FIG. 1 to achieve NAND gate logic, which due to its universality is intended to be representative of any arbitrary gate or type of logical operation or process.

Nanostructures can be formed from a variety of materials and to take a variety of shapes. Carbon-based nanostructures in particular can take a variety of different forms of different shapes. Among these are carbon nanotubes (CNTs), carbon nanocones, carbon nanofibers and carbon nanowires, which in at least some embodiments can range in size from 1 nm to 1000 nm. CNTs in particular display exceptional mechanical, chemical and thermal stability. Due to their size and shape, CNTs are capable of having high aspect ratios (e.g., high length/diameter ratios), and consequently are capable of having a higher efficiencies of field emission (e.g., higher current densities given the same or smaller applied voltages), which can be exploited for memory technologies such as flash memory technologies.

Referring to FIG. 1, an exemplary memory cell 2 employing nanostructures in accordance with at least one embodiment of the present invention is shown by way of a schematic cross-sectional view. In the present embodiment, as shown by the schematic cross-sectional view of FIG. 1, the memory cell 2 is a CNT-based nonvolatile read-write memory cell. More particularly, the memory cell 2 includes first and second triodes 4 and 6, respectively (outlined by dashed lines). The first and second triodes 4 and 6 respectively include first and second CNTs 12 and 14, which are separately assembled on first and second silicon substrates 8 and 10, respectively.

As further shown by FIG. 1, the memory cell 2 includes upper and lower portions 16 and 18, respectively. The upper portion 16 includes the first silicon substrate 8, which is ion implanted to create both a lightly doped region 20 and an adjacent highly doped region 22. As will be described further below with reference to FIG. 2, the lightly doped region 20 serves as a current limiting resistor 42, while the highly doped region 22 acts as a Word Line (WL) for the memory cell 2. The first CNT 12 is coupled to the lightly doped region 20 of the first silicon substrate 8 by way of an intermediate metallic layer 24, which is used as an electrical connection/contact particularly because it facilitates growing of the CNT in relation to the substrate. Preferably, the intermediate metallic layer 24 is made from a metal such as iron, nickel, cobalt, chromium, or tungsten (or any other 'transition metal' from the periodic table) that facilitates the growing of the CNT 12.

Additionally, a relatively thick (e.g., in the range of 10 nm-1 µm) silicon oxide (gate oxide) layer 26 is deposited along the first silicon substrate 8, extending away from the substrate in generally the same direction as the first CNT 12, and further a metal overlayer 28 is deposited on the surface of the silicon oxide layer 26 that is opposite to the surface interfacing the first silicon substrate 8. Both the silicon oxide layer 26 and metal overlayer 28 are formed so that a space exists between the respective layers and the first CNT 12 (e.g., the CNT extends within a channel formed within the silicon oxide layer and the metal overlayer). The silicon oxide layer 26 reduces the gate capacitance, and can be deposited along the first silicon substrate 8 through chemical vapor deposition ("CVD") or physical vapor deposition (PVD) techniques. As will be described further below, the metal overlayer 28 acts as a Bit Line (BL) for the memory cell 2.

As for the lower portion 18 of the memory cell 2, that portion includes the second silicon substrate 10, a silicon oxide layer 30 that is formed along one surface of the silicon substrate 10, and an additional metal layer 32 that is formed along the silicon oxide layer 30, such that the silicon oxide layer is sandwiched between the additional metal layer and the second silicon substrate. Additionally, the lower portion 18 includes the second CNT 14, which is attached to and extends outward away from the additional metal layer 32 (e.g., in a direction away from the second silicon substrate 10). The silicon oxide layer 30 is of relatively narrow extent (e.g., 1-20 nm). As described further below, the additional metal layer 32 deposited onto the silicon oxide layer 30 can be etched into isolated islands using photolithography so as to form a floating node capacitor 40 (described further with reference to FIG. 2), and further serves as the anode of the first triode 4 as well as the cathode of the second triode 6.

In addition, the lower portion 18 of the memory cell 2 also includes an additional silicon oxide layer 34 that is attached to the additional metal layer 32 and also extends outward away from the second silicon substrate 10, in the same direction as the second CNT 14. Further, a metal overlayer 36 is attached to the additional silicon oxide layer 34 such that the additional silicon oxide layer is sandwiched between the overlayer 36 and the additional metal layer 32, the metal overlayer serving as a Sense Line (SL) of the memory cell 2. As with the silicon oxide layer 26 of the upper portion 16 of the memory cell, the additional silicon oxide layer 34 is relatively thick (e.g., in the range of 10 nm-1 µm) and, in particular, thicker than the silicon oxide layer 26. Also, as with the silicon oxide layer 26 and metal overlayer 28 of the upper portion 16, the metal overlayer 36 and additional silicon oxide layer 34 surround and form a channel around the second CNT 14.

In the present embodiment, the CNTs 12 and 14 are respectively oriented to extend perpendicularly away from the respective substrates 8 and 10, respectively, such that the CNTs are "vertically oriented" relative to the substrates, assuming the substrates are "horizontally oriented". Use of such vertical CNTs 12, 14 allows for the memory cell 2 to take a more compact form than if the CNTs were oriented in a different manner (e.g., obliquely or in a parallel manner) relative to the substrates. It should be noted that the terms "upper", "lower", "vertical" and "horizontal" are only being used for convenience herein and not as an indication of the actual physical locations or orientations of the components of the memory cell 2 relative to a physical ground or otherwise.

As is evident from FIG. 1, while the upper and lower portions 16 and 18 of the memory cell 2 are similar in that they each include a respective substrate 8 and 10, a respective CNT 12 and 14, a respective thick silicon oxide layer 26 and 34, and a respective metal overlayer 28 and 36, the upper and lower portions nevertheless are not identical to one another. More particularly, the silicon oxide layer 26 and metal overlayer 28 of the upper portion 4 extend substantially the entire width of the substrate 8 as shown (albeit in practice such substrate can potentially extend beyond the limits shown), such that those layers 26, 28 extend over or overhang the second CNT 14 of the lower portion 18 when the two portions 16, 18 are assembled in relation to one another as shown. Thus, the electrons emitted by the second CNT can be received by the metal overlayer 28.

In contrast, the silicon oxide layer 34 and metal overlayer 36 of the lower portion only extend about half to three-fifths of the width of the substrate 10 as shown, such that those layers do not extend underneath the first CNT 12. At the same time, the metal layer 32 and the silicon oxide layer 30 do extend substantially the entire width of the substrate 10 as shown, such that a portion 38 of the metal layer 32 positioned beneath the first CNT in particular is not covered by the silicon oxide layer 34 but rather is exposed. Thus, electrons emitted by the first CNT 12 are received by the metal layer 32 rather than by the metal overlayer 36.

When the upper and lower portions 16 and 18 are assembled in relation to one another as shown, the first and second triodes 4 and 6 are formed by complementary components of those portions. More particularly, the first triode 4 is formed by the first CNT 12, the Bit Line formed by the metal overlayer 28, the intermediate metallic layer 24, and the exposed portion 38 of the metal layer 32 of the lower portion 18. More particularly, the metal overlayer 28 constitutes the gate of the triode 4, the intermediate metallic layer 24 constitutes the cathode of the triode, and the metal layer 32 constitutes the anode of the triode. By comparison, the second triode 6 is formed by the second CNT 14, the Sense Line formed by the metal layer 36, which constitutes the gate of that triode, the Bit Line formed by the metal layer 28, which constitutes the anode of that triode, and the metal layer 32, which constitutes the cathode of that triode.

It should be evident from the above discussion that, in the present embodiment, single metal layers are used for dual purposes. More particularly, the metal layer 28 forming the Bit Line constitutes both the gate of the first triode 4 and the anode of the second triode 6, while the metal layer 32 constitutes both the anode of the first triode and the cathode of the second triode. Further, the metal layer 32 also constitutes one capacitor plate of the capacitor 40, the other capacitor plate of which is formed by the substrate 10. More particularly, the capacitor 40 is formed between electrodes formed by the metal layer 32 and the substrate 10, with the in-between silicon oxide layer 30 as the capacitor dielectric. It should further be noted that the capacitor 40 serves as a storage capacitor, while the resistor 42 formed by the lightly doped region 20 mentioned above serves as a current limiting ballast resistor.

Referring additionally to FIG. 2, the memory cell 2 is further shown by way of a circuit diagram, in order to clarify the relative configuration and interoperation of the components of the memory cell. As shown by FIG. 2, the memory cell 2 includes the first and second triodes 4 and 6, the capacitor 40, and the resistor 42. Also, the memory cell 2 includes the Bit Line (BL), the Write Line (WL) and the Sense Line (SL).

More particularly, the Write Line is coupled by way of the resistor 42 to a cathode T of the first triode 4, which corresponds to the intermediate metallic layer 24 of FIG. 1, and from which the first CNT 12 (represented by an arrow) extends. If the CNT is conducting/metallic, the cathode T could also be considered to include both the intermediate metallic layer 24 and at least the portion of the CNT 12 that is in contact with the intermediate metallic layer (e.g., the bottom of the CNT), or even the entire CNT. Nevertheless, for purposes of clarifying the discussion below, the CNT 12 will be considered as constituting a structure separate from the cathode T. The Bit Line is coupled both to a gate 46 of the first triode 4 and to an anode 48 of the second triode 6, both of which correspond to the metal overlayer 28 of FIG. 1. The Sense Line is coupled to a gate 50 of the second triode 6, which corresponds to the metal overlayer 36 of FIG. 1. Finally, an anode F of the first triode 4 is shown to be the same node as a cathode 44 of the second triode 6. Both the anode F and the cathode 44 correspond to the metal layer 32 of FIG. 1, which additionally serves as one of the plates of the capacitor 40, the other plate of which is coupled to ground (e.g., by way of the substrate 10). An additional capacitor 41 shown in FIG. 2 is not a distinct component of the memory cell 2, but rather merely represents an associated capacitance existing between the Bit Line and ground. The additional capacitor 41 serves to charge up the Bit Line and can be, at least in some embodiments, merely a parasitic capacitance or an extra added capacitance.

The memory cell 2 structures illustrated in FIG. 1 can be fabricated using conventional micro- and nano-fabrication techniques. Fabrication is performed separately with respect to the first and second silicon substrates 8 and 10, respectively, to form the upper and lower portions 16 and 18. The substrates 8, 10 (and corresponding upper and lower portions 16, 18) are then aligned, for dense integration, using established flip-chip technologies.

To construct the upper portion 16, the first silicon substrate 8 is formed to have the highly and lightly doped regions 22 and 20, respectively. Next, the relatively thick silicon oxide layer 26 is deposited on the substrate 8 and, subsequently, the metal overlayer 28 is deposited on the silicon oxide layer, and patterned via photolithography to form the Bit Line (BL). Electron beam lithography can then define a gate aperture, through which both the silicon oxide layer 26 and the metal overlayer 28 are etched vertically to form the channel within which is to be situated the first CNT 12. Upon formation of the channel, the intermediate metallic layer 24 is formed on the re-exposed lightly doped region 20 of the first silicon substrate 8. More specifically, a suitable diffusion barrier (e.g., TiN) and catalyst (e.g., Ni, Co, W, Cr, Fe or any other transition metal) are deposited through the gate aperture. The diffusion barrier is deposited first, followed by subsequent deposition of the metal catalyst layer. Given this intermediate metallic layer 24, the first CNT 12 is then grown by CVD. The grown CNT 12 constitutes the field emission tip of the first triode 4 (as noted above, the cathode T of the triode for purposes of the present discussion is considered as being the intermediate metallic layer 24, albeit the cathode can also be understood to include the bottom portion of the CNT in contact with that layer or even the entire CNT).

As for the lower portion 18, that portion is formed by successively laying down the silicon oxide layer 30 by way of CVD, the metal layer 32 by way of metal deposition, the silicon oxide layer 34 again by way of CVD, and the metal overlayer 36 again by way of metal deposition. The metal overlayer 36 is then patterned into the Sense Line (SL) by photolithography. Next, the silicon oxide layer 34 is etched away to create the exposed portion 38 of the metal layer 32, which is to form the anode F of the first triode 4/cathode 44 of the second triode 6. Subsequently, electron beam lithography is used to define the gate aperture or channel within which is to be situated the second CNT 14. Once this channel is formed and the metal layer 32 is re-exposed at the base of this channel, the catalyst for growth of the second CNT 14 of the second triode 6 is placed along the metal layer and the CNT is formed.

During operation of the memory cell 2, one can obtain predictable, regulated field emission from the ends of the CNTs 12, 14 of the triodes 4, 6 (treating those CNTs as part of the cathodes of those triodes). More particularly, the charged carriers' emission current (I) from each of the CNTs 12, 14 is determined by the Fowler-Nordheim (F-N) relationship:

$$I = aV^2 \exp\left(-\frac{b\varphi^{3/2}}{\beta V}\right) \quad (1)$$

where V is the applied voltage, $\varphi$ the work-function of the surface and $\beta$ is the field enhancement factor due to the radius of curvature of the emitting tip (a and b are phenomenological constants that are determined by the particular experimental setup).

With respect to the CNTs 12, 14, the field enhancement factors $\beta$ in particular can be as high as 5000 or larger (at least an order of magnitude larger than state-of-the-art Spindt-type field emission tips), depending on the aspect ratio (which is the height/radius of the CNT), due to the nanometer radius of curvature, which translates to a higher emission current at a given voltage. The use of gate electrodes as discussed above (e.g., the gates 46, 50 of FIG. 2) allows for the construction of active field emission devices and avoids the performance trade-offs that restrict conventional flash memory tunneling oxide designs. In at least some embodiments, the memory cell 2 is operated in a vacuum to form a vacuum based field emission system (e.g., the CNTs in particular are positioned within a vacuum-sealed region), which can then replace the hot carrier mechanism used in current complementary metal oxide semiconductor (CMOS) field effect transistor-based flash memory technology. The use of a vacuum allows the memory cell to be programmed and erased solely via tunneling. Further, a higher device speed and a larger current drive are also ensured by operation in vacuum. Additionally, there is an added advantage with at least some embodiments of the present invention in that the active transistors (or other active devices) of the memory core can be dispensed with. Further, even when transistors/active logic devices are needed or employed, those devices can be fabricated using techniques/principles similar to those discussed above.

It has been experimentally observed that field emission from CNTs can be obtained for up to 1500 hours at reasonable vacuum levels of 1 Torr. In conventional flash memory technology, a field effect transistor within the memory cell and an external sense amplifier are both needed to sense the limited charge that passes through the tunneling oxide. However, the high current capacity of the CNTs—up to and even exceeding 0.2 mA per single nanotube—can eliminate the need for an amplifier within the memory cell. The use of common fabrication techniques and advanced packaging ("flip-chip") technologies, incorporating three-dimensional circuit integration, allow the implementation of the proposed CNT based circuitry in a highly compact manner.

Although the present embodiment of FIGS. 1-2 envisions the formation and implementation of CNTs, the present invention is intended to encompass the use of metallic carbon nanostructures of various other morphologies besides tubes (e.g., cones, wires and fibers) and having a range of diameters (e.g., 1 nm to 100 nm) and lengths (e.g., 10 nm to 100 μm). Although such metallic carbon nanostructures can be fabricated upon a substrate by way of CVD, other synthesis techniques can also be used to form such nanostructures. Further, in at least some embodiments, an electric field can be used to orient one or more nanostructures in a desired orientation relative to the substrate, e.g., to orient the nanostructures perpendicularly with respect to the substrate.

Turning to FIG. 3, exemplary read-write operation of the proposed nonvolatile memory cell 2 of FIGS. 1 and 2 is graphically shown, in which the voltages on the control lines (SL, BL, and WL) are varied to read, write and store logic values of 0 and 1 in the cell. To generate the information shown in FIG. 3, a SPICE circuit simulation model, developed for a field emission triode (via the MULTISIM® software platform of Electronics Workbench, of Toronto, Ontario, Canada), was used to simulate the proposed memory cell, as shown schematically in FIG. 2.

In modeling the memory cell 2, F-N parameters are estimated from previous work, where field emission from a gated CNT structure, using a 1.1 μm tip-to-gate spacing was reported (see, e.g., C. H. Chao and C. T. Pan, Technical Proceedings of the 2004 NSTI Nanotechnology Conference and Trade Show, Volume 3, Page 472, (2004), which is hereby incorporated by reference herein). While previous work used photolithography to fabricate the structures, we propose the use of electron-beam lithography, which can give a reduced CNT to gate (FIG. 1) spacing, for even higher field emission performance. With a spacing of 100 nm, we extrapolate F-N coefficients of $$a = 0.75 \frac{A}{V^2}$$

and the factor $$\left(\frac{b\phi^{3/2}}{\beta}\right) = 50.7 \text{ V}.$$

We estimate the capacitance of the capacitor 41 of FIG. 2 as 46.1 fF, from previous studies on vacuum microelectronic devices. Based on the geometry of devices in this particular study, the capacitance of the capacitor 40 of FIGS. 1 and 2 (the storage node capacitance) was taken to be 850 aF. Further, the resistance of the resistor 42 of FIGS. 1 and 2 (the ballast resistor), used to limit emitter tip current, was given a value of 50 kΩ. However, the capacitance and the resistance can assume any value and depend on the particular experimental setup.

FIG. 3 in particular shows two representative cycles of operation of the nonvolatile CNT-based memory cell 2 operating at 0.25 GHz. The voltage across the capacitor 40 (the storage node capacitance) is assumed to be initially positive—corresponding to a logical value of 1, as it would be after being erased by a read cycle. Given the following applied voltages as shown in Table 1, FIG. 3 illustrates four different operational behaviors occurring at different times, namely, "Write 0," "Read 0," "Read 1" and "Write 1" behaviors as described below.

TABLE 1

| Control | Operation | | | |
|---|---|---|---|---|
| | Write 0 | Read 0 | Write 1 | Read 1 |
| Sense Line (SL) | 0 V | 3 V | 0 V | 3 V |
| Bit Line (BL) | 1.5 V | 1.5 V | −2 V | 1.5 V |
| Write Line (WL)/Node T | −1.5 V | 2 V | −1.5 V | 2 V |

A first, "Write 0" behavior occurs as shown in FIG. 3 between about 0 ns and 2 ns. At 0 ns, the SL is brought to 0 V so the second triode 6 is turned off during the write cycle. The BL is set to 1.5 V in order to write a 0 to the memory cell 2 (the input to BL being the complement of the data to be written). The WL is brought to approximately −1.5 V, as shown by the voltage at the node (cathode) T of FIG. 2. The potential difference between T and BL causes the first CNT 12 to emit electrons, such that current flows through the first triode 4 to the anode F and such that the capacitor 40 is charged to a negative value, giving the memory cell a logical value of zero. Note that this voltage at the anode F, which is identical to the voltage at the cathode 44 of the second triode 6, is not low enough to induce any significant current conduction by that second triode (e.g., by the second CNT 14). The resistor 42 serves to limit the current to 4 μA. If the SL remains at ground (e.g., the circuit remains idle) for one year, the second triode 6 will increase the voltage of T by only 0.2 V, reducing the charge available during the next read cycle by less than 7%. Thus, the present embodiment has minimal charge leakage, such that the lifetime/viability afforded by the memory architecture of the present memory cell 2 in terms of retaining stored bit information (e.g., 1s and 0s) is quite good.

A second, "Read 0" behavior occurs as shown in FIG. 3 between about 2 ns and 4 ns. As shown, to read the memory cell 2, the SL is asserted at 2.6 ns, by raising the voltage of the SL to about 3V. The BL remains at 1.5 V as was the case during the "Write 0" operation. As a result, the second triode 6 turns on in response to the potential difference between the gate 50 (SL) and the cathode 44 (which is at the same voltage as the anode F), allowing the charge to flow out of the capacitor 40 through the second triode 6 to the BL and into the capacitor 41, decreasing the voltage of the capacitor 41 by approximately 40 mV as shown at a region 46 of FIG. 3. This decrease in the voltage of the capacitor 41 thus serves as an indication that the memory cell 2 (particularly the capacitor 40) had been storing a 0 value. In a real circuit, the decrease in the voltage of the capacitor 41 would be reduced somewhat relative to that shown due to gate current, which has been found to be <1% of the total current in similar devices, and was neglected in the present circuit model. In at least some embodiments, a sense amplifier can be used to detect the swing in the voltage of the capacitor 41.

Further as shown, the voltage of the anode F/cathode 44 tracks the upswing in SL initially, but the voltage between the anode F/cathode 44 and the gate 50 of the second triode 6 gradually decreases as SL is held constant, causing the second triode to turn off. This self-limiting behavior protects the tip of the second CNT 14 from over-current damage. Also, during the "Read 0" operation, the WL is held high so that the first triode 4 is turned off, as indicated by the relatively high voltage (approximately 2 V) of the node T. It should further be noted that this "Read 0" operation resets the memory cell 2 to a logical value of 1, by charging the capacitor 40 to a positive voltage.

A third, "Write 1" operation of the memory cell 2 is further shown in FIG. 3 between approximately 4 nanoseconds and 6 nanoseconds. In order to write a value of 1 to the memory cell 2, the BL is brought to approximately −2V, and the SL is returned to ground. At 3.9 ns, the WL is then brought to approximately −1.5 V, as indicated by the signal at the node T. Since the BL is at a lower potential than the node T, the first triode 4 does not turn on and the memory cell 2 retains a logical value of 1.

Finally, a fourth "Read 1" operation of the memory cell 2 is shown in FIG. 3 between approximately 6 nanoseconds and 8 nanoseconds. At 6.1 ns in particular, the SL is asserted to a positive voltage of about 3 V, to carry out a second read cycle. Since in this case the voltage across the capacitor 40 is positive and the potential difference between the anode F/cathode 44 and the SL is not adequate to turn on the second triode 6, as was the case at the end of the previous read cycle, only a negligible amount of charge is transferred from the memory cell 2 to the BL. Consequently, the BL swings by only 0.6 mV, much less than the 40 mV voltage swing encountered in the previous Read cycle (this 0.6 mV variation is not particularly visible in FIG. 3). At the same time, there is no leakage current from the first triode 4, as its emission is shielded by the gate 46, also the BL. Thus, the charge stored by, and voltage across, the capacitor 41 does not significantly change. Consequently, the voltage across the capacitor 41 indicates that the memory cell 2 (particularly the capacitor 40) is storing a 1 value. Further, this "Read 1" mode of operation coupled with the rectifying behavior of the second triode 6 allows the memory cell 2 to retain its value until the first triode 4 is activated.

As should be evident from the above discussion, the memory cell 2 is capable of retaining either logical value (0 or 1) without any external power input, and thus the memory cell constitutes nonvolatile memory. The most energy intensive operations during operation of the memory cell 2 are reading and writing a value of 0. It should also be pointed out that a Read operation must always be followed by a Write operation to replace data that is lost by the Read operation. That is, the Read operations are destructive processes such that they must always be followed immediately by Write operations.

Figure 4:
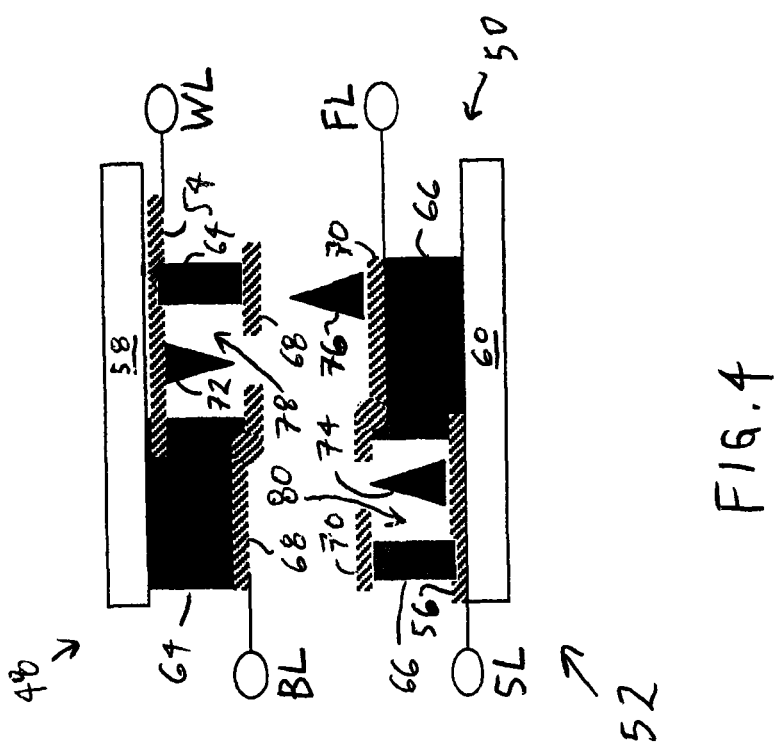
FIG. 4 is a schematic cross-sectional view of another exemplary memory device in accordance with at least one embodiment of the present invention.

Although the memory cell 2 discussed with reference to FIGS. 1-3 includes only the two CNTs 12, 14, the present invention is intended to encompass other types of memory devices that include three or more CNTs as well. For example, referring to FIG. 4, an additional exemplary embodiment of memory cell 52 is shown that includes three carbon nanostructures rather than two. As shown, the memory cell 52 like the memory cell 2 includes upper and lower portions 48 and 50, respectively, having first and second silicon substrates 58 and 60, respectively. First and second metal layers 54 and 56 are respectively formed along inwardly-facing surfaces of the first and second silicon substrates 58 and 60, respectively. The first and second metal layer 54, 56 respectively constitute the Write Line (WL) and the Sense Line (SL) of the memory cell 52.

Additionally, the memory cell 52 also has thick first and second silicon oxide layers 64 and 66, respectively, which extend inward from the respective substrates 58 and 60, respectively, and which correspond to the silicon oxide layers 26, 34 of the memory cell 2 of FIG. 1. In the present embodiment, the silicon oxide layer 64 and 66 are in contact with their respective substrates along a portion of their length along those substrates, but are instead in contact with the respective metal layers 54, 56 where those metal layers are affixed to the respective substrates (albeit the metal layers need not be directly affixed to the substrates, as illustrated by the example of FIG. 1 in which the metal layer 32 is separated from the substrate 10 by the silicon oxide layer 30 so as to result in a capacitance between the metal layer and the substrate). Further, along the inwardmost surfaces of the silicon oxide layer 64 and 66, additional metal overlayers 68 and 70, respectively, are affixed, such that the silicon oxide layers are sandwiched between the additional metal overlayers and the substrates 64, 66/metal layers 54, 56. The additional metal overlayers 68 and 70 respectively constitute the Bit Line (BL) and the Float Line (FL) of the memory cell 52.

Further as shown, the memory cell 52 includes first and second carbon nanostructures, which in the present embodiment are first and second CNTs 72 and 74, respectively (although, as discussed above, in alternate embodiments other types of nanostructures can also be employed, such as nanocones). As shown, the first and second CNTs 72 and 74 are respectively positioned to extend within respective first and second channels 78 and 80 that are formed within the additional metal overlayers 68 and 70, respectively, and within the silicon oxide layers 64 and 66, respectively. The first CNT 72 more particularly is formed upon the metal layer 54 and extends downward toward the metal overlayer 68, while the second CNT 74 more particularly is formed upon the metal layer 56 and extends upward toward the metal overlayer 70. When the upper and lower portions 48 and 52 are assembled as shown, the respective CNTs 72, 74 (and corresponding channels 78, 80) are not aligned with one another but rather are positioned to the side of one another. Thus, the metal overlayer 68 extends uninterrupted above the second CNT 74 while the metal overlayer 70 extends uninterrupted beneath the first CNT 72.

The metal layer 54, first CNT 72, and metal overlayers 68, 70 can be understood to form a first triode while the metal layer 56, second CNT 74 and metal overlayers can be understood to form a second triode. More particularly, the metal layers 54, 56 can be considered the cathodes of the respective triodes, while the metal overlayer 68 constitutes the gate of the first triode and the anode of the second triode and the metal overlayer 70 constitutes the gate of the second triode and the anode of the first triode. As discussed above with respect to FIG. 1, the bottom portions of the CNTs 72, 74 (e.g., the portions in contact with the metal layers 54, 56) can also be considered part of the cathodes of the triodes (as can the entire CNTs if, and only if, the CNTs are well conducting/metallic). As will be described in further detail below, the first CNT more particularly can be understood to constitute a "Write tip" of the memory cell 52, while the second CNT can be understood to constitute a "Read tip" of the memory cell.

In contrast to the memory cell 2 of FIGS. 1-3, the memory cell 52 also includes a third CNT 76 which can be understood to constitute a "Erase tip" of the memory cell. As shown, in contrast to the CNTs 72, 74, the CNT 76 is mounted directly upon the metal overlayer 70 and extends upward toward the metal overlayer 68. In the present embodiment, the third CNT 76 is positioned slightly to the right of the first CNT 72, which is positioned to the right of the second CNT 74. Thus, the primary differences between the memory cell 52 and the memory cell 2 are the inclusion, in the memory cell 52, of the third CNT 76 and the fourth input/output terminal (the Float Line), along with the facts that (a) this Float Line rather than the Sense Line constitutes the gate of the second nanostructure (the second CNT 74), and (b) the metal overlayer 70 constituting this Float Line extends beneath the first CNT 72 so as to form the anode of that CNT even though the Float Line forms the gate of the CNT 74 rather than its cathode.

The memory cell 52 can be termed "tunneling random access memory" because the operation of the memory cell depends on the electrons tunneling (more specifically, the Fowler-Nordheim Tunneling principles are followed, in accordance with equation (1) above, with respect to the electrons proceeding from the CNTs through the vacuum to the anode), and can be operated as follows. The Bit Line sets the negative (e.g., complement) of the value to be stored at the Float Line. A positive voltage difference between the Bit Line and the Write Line causes the first "Write tip" CNT 72 to emit (or not emit) electrons and to store (or not store) charge at the Float Line, which serves as the memory of the device. Further, when the Sense Line is activated, it causes the second "Read tip" CNT 74 to emit (or not emit) charge depending upon the whether the voltage on the Float Line is more positive (or more negative with respect to the Sense Line), which affects operation of the third "Erase tip" CNT 76 (e.g., a negative or zero value implies no emission and a positive vale implies emission). Table 2 shows in more detail how particular values applied the Bit Line and/or existing on the Float Line impact performance of the third "Erase tip" CNT 76 as well as the resulting effect upon the value on the Bit Line.

TABLE 2

| Bit Line (BL) | Float Line (FL) | Erase Tip Emits? | Emission Affects Bit Line? |
|---|---|---|---|
| 0 | 0 | Yes | No (0) |
| 0 | 1 | No | No (0) |
| 1 | 0 | Yes | No (0) |
| 1 | 1 | No | Yes (1) |

From Table 2, it is apparent that, when the Sense Line is triggered, no emission from the second "Read tip" CNT 74 will occur if the Float Line transitions from a high (e.g., 1) value to a low (e.g., 0) value and consequently the Bit Line maintains its existing status. More particularly, on the one hand if the Bit Line is a low (e.g., 0) value, and the Float Line transitions in this manner, then the first "Write tip" CNT 72 can be made to emit electrons to the Float Line, and then the third "Erase tip" CNT 76 further emits electrons to the Bit Line, thus maintaining its low value. On the other hand, if the Bit Line is a high (e.g., 1) value, and the Float Line transitions in this manner, then the first "Write tip" CNT 72 can be made to emit electrons to the Float Line, which then becomes negative, and consequently the third "Erase tip" CNT 76 emits electrons to the Bit Line, causing it to switch states to a low value. Therefore, the Bit line (BL) sets the negative of the value to be stored at the float node. A positive (/negative) voltage difference between the Bit Line and the Write tip/Write Line causes the CNT 72 to emit (/not emit) electrons and store (/not store) charge in the float node. The Sense Line when activated causes CNT 74 to emit (/not emit) charge depending on whether the voltage of the Float Line or CNT 76 is negative (/positive).

Also from Table 2, it is apparent that, when the Sense Line is triggered, emission from the second "Read tip" CNT 74 does not occur if the Float Line transitions from a low (e.g., 0) value to a high (e.g., 1) value, such that the Bit Line takes on a low (e.g., zero) value. More particularly, on the one hand if the Bit Line is a low (e.g., 0) value, and the Float Line transitions in this manner, then the first "Write tip" CNT 72 does not emit electrons to the Float Line, and third "Erase tip" CNT 76 does not emit electrons to the Bit Line, thus maintaining its low value. On the other hand, if the Bit Line is a high (e.g., 1) value, and the Float Line transitions in this manner, then the first "Write tip" CNT 72 emits electrons to the Float Line, and the third "Erase tip" CNT 76 does emit electrons to the Bit Line, thus causing it to take on a low (e.g., 0) value.

In summary, if the Float Line is at a zero value, there is no emission from the Sense Line and the Bit Line retains the previously stored value. On the other hand, if the Float Line is asserted positively, under emission from the Sense Line, the Bit Line is charged negatively and the CNT 72 does not emit charge. The float node retains the previously stored value. The charge is stored on the Float Node (e.g., the memory location) and is accessed (/not accessed) by asserting (/not asserting) the Float Line.

Figure 5:
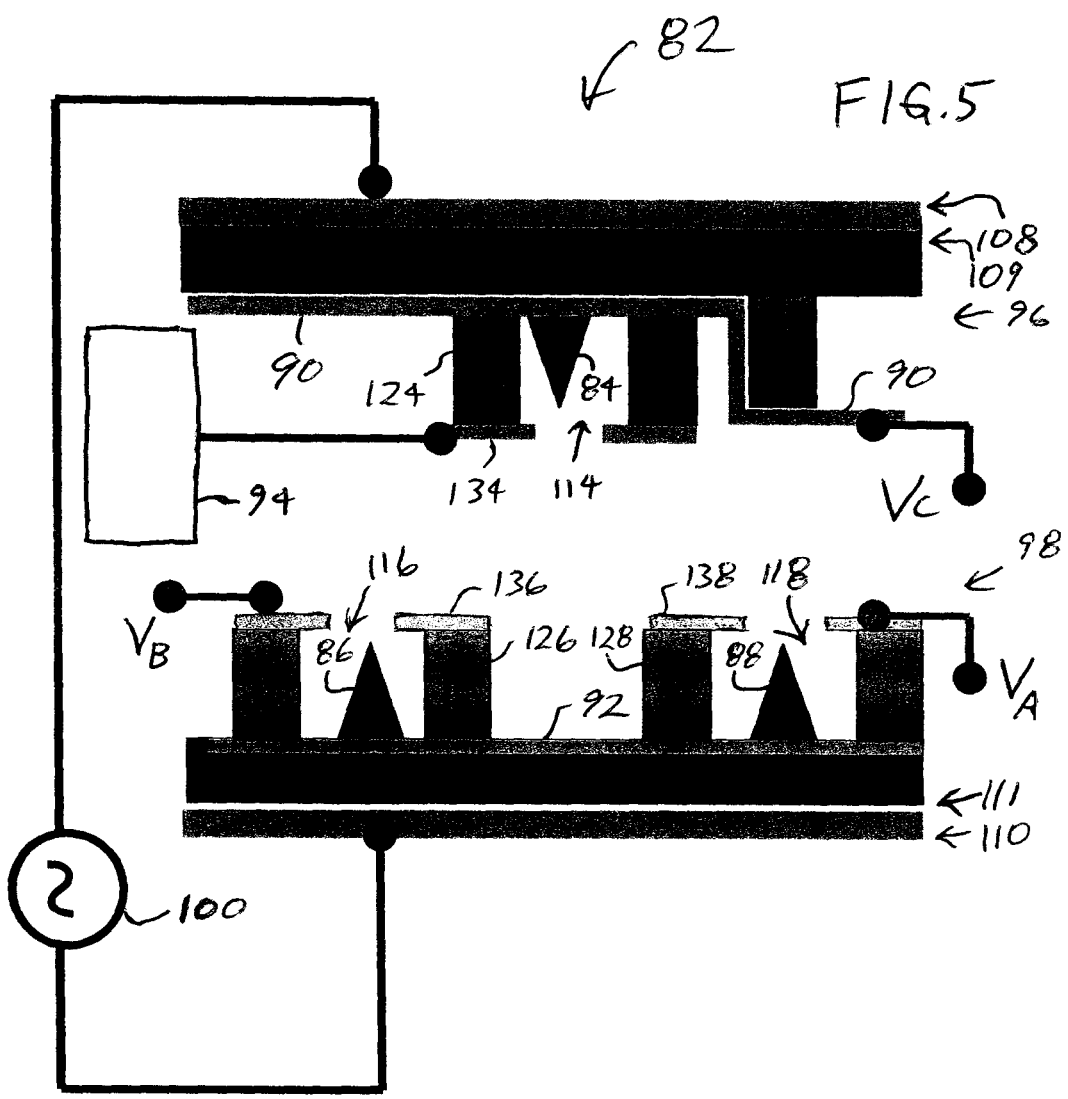
FIG. 5 is a schematic cross-sectional view of another exemplary memory device in accordance with at least one embodiment of the present invention.

Turning to FIG. 5, yet another exemplary embodiment of a memory cell 82 is shown. Operation of each of the memory cells 2 and 52 discussed above presumes that a constant direct current (DC) bias voltage is applied across the respective memory device, particularly across the substrates of the memory device. Such bias voltage can take on various ranges, for example, +3 Volts to −3 Volts, +3 Volts to 0 Volts, or 0 Volts to −3 Volts. In contrast, the memory cell 82 of FIG. 5 envisions the application of an alternating current (AC) bias voltage to the memory cell, so as to result in lower overall power dissipation by the memory cell. Thus, the memory cell 82 can be referred to as an "AC Logic" memory cell.

As shown in FIG. 5, the memory cell 82 is similar to the memory cell 52 insofar as it includes upper and lower portions 96 and 98 having first and second silicon substrates 108 and 110, respectively, as well as first, second and third CNTs 84, 86 and 88, respectively. As with the memory cell 52, the first CNT 84 is mounted upon (and extends downward from) a metallic layer 90 that is mounted to the first silicon substrate 108, in this case by way of an intermediate silicon oxide layer 109. Also, the second CNT 86 is mounted upon (and extends upward from) a metallic layer 92 that is mounted to the second silicon substrate 110, in this case by way of an intermediate silicon oxide layer 111. However, the third CNT 86 is also mounted upon (and extends upward from) the metallic layer 90 rather than upon any metal overlayer.

While the third CNT 86 is not mounted upon a metal overlayer, each of the CNTs 84, 86 and 88 nevertheless extends through a respective channel 114, 116, and 118 formed within a silicon oxide layer 124, 126 and 128, respectively, and a metal overlayer 134, 136 and 138, respectively. As shown, the silicon oxide layer 124 is sandwiched between the metal overlayer 134 and the metal layer 90, while the silicon oxide layer 126 is sandwiched between the metal overlayer 136 and the metal layer 92 and the silicon oxide layer 128 is sandwiched between the metal overlayer 138 and the metal layer 92. Further, the CNTs 86 and 88 are arranged to the left and the right of the CNT 84 such that the CNT 84 extends downward from the metal layer 90 while the CNT 86 and CNT 88 extend upward from the metal layer 92 on either side of the CNT 84.

More particularly, the CNTs 84, 86 and 88 are arranged/fabricated in relation to the metal layers 90, 92 and the metal overlayers 134, 136 and 138 to form three triode structures. With respect to the CNT 86, the metal layer 90 is the anode, the metal overlayer 136 is the gate, and metal layer 92 (along with possibly some or all of the CNT 86 itself) constitutes the cathode. As for the CNT 88, the metal layer 90 is the anode, the metal overlayer 138 is the gate, and the metal layer 92 (along with possibly some or all of the CNT 88 itself) constitutes the cathode. Further, with respect to the CNT 84, the metal layer 92 is the anode, the metal overlayer 134 is the gate, and the metal layer 90 (along with possibly some or all of the CNT 84 itself) constitutes the cathode. Thus, aside from their anodes, the triodes employing the CNTs 86 and 88 are fabricated on the substrate 110 while the other triode employing the CNT 84 is fabricated on the other substrate 108. As discussed previously with respect to the embodiment of FIG. 1, the two substrates 108, 110 are flip-chip aligned for dense integration.

Further as shown, the memory cell 82 has numerous accessible nodes. The metal overlayers 138 and 136 respectively constitute first and second voltage input nodes $V_A$ and $V_B$, respectively, which are respectively analogous to the Bit Line and the Write Line of the memory cell 52. Further, the metal layer 90 constitutes a third voltage input node $V_C$, which is analogous to the Sense Line of the memory cell 52, and the remaining metal overlayer 134 is coupled to a clock 94. Further, an AC bias signal is provided across the substrates 108, 110 by an AC source 100. The clock provides a synchronization signal to the memory cell 82 that is used for accessing the memory cell in order to prepare the memory cell for writing.

The carbon nanostructure-based architectures for nonvolatile memory cores/devices described above with reference to FIGS. 1-5 are only a few of a variety of different architectures that are encompassed by the present invention. For example, while the above-described embodiments employ CNTs, the present invention also encompasses embodiments employing other forms of metallic carbon nanostructures having other shapes (e.g., fibers or wires), various form factors, and a variety of sizes (e.g., in the range of 1 nm-1000 nm). The above-described embodiments and other embodiments of the present invention are easily scalable to various (e.g., lower) operating voltages and much smaller sizes (for example, some alternate embodiments can include single walled carbon nanotubes with diameters around/in the range of 1 nanometer) than those discussed above. Further, memory devices employing two or more memory cells such as those described above (e.g., in which two or more memory cells are joined/tagged/assembled together in tandem or otherwise to create more complex device architectures) are also intended to be encompassed within the present invention.

Embodiments of the present invention are applicable to various types of memory, including random access memory (RAM) and read only memory (ROM). Various forms of the present invention can be employed in a variety of different types of memory devices, not merely flash memory devices or non-volatile memory devices. Also, while the above-described device operates at speeds of up to 0.25 GHz, which have been shown to be feasible through circuit simulations, it is also expected that various embodiments of the present invention could operate at even higher speeds, e.g., up to and exceeding 10 or 100 GHz (indeed, operation at frequencies even in the Terahertz range may be possible). When integrated with flip-chip technology, memory devices such as those described above offer a possible solution to the problem of flash memory scaling coupled with the advantages of high density integrated circuitry and a faster speed of operation. Further, the above-described embodiments of FIGS. 1-5 are intended to demonstrate that memory cells such as those discussed above can be operated using either AC or DC power supplies. Indeed, in at least some embodiments, a given memory cell can be configured for operation using both AC and DC power.

Memory devices in accordance with at least some embodiments of the present invention are capable of providing one or more advantages. To begin with, in some embodiments, the use of a carbon nanotube-based memory core circumvents the issues of transistor scaling and hot electron effects that limit conventional memory devices, and makes use of the enhanced field emission that can be obtained from nanometer sized CNTs or other carbon nanostructures. Also, in at least some embodiments, the proposed design provides advantages such as lower power levels due to the higher efficiency of field emission from nanostructures, greater circuit density, greater reliability due to the absence of tunneling through oxide, and immunity to ionizing radiation.

Further, there is an added advantage, in at least some embodiments of our design, that the active transistors in the memory core can be dispensed with. Also, in at least some embodiments in which the memory cells are operated in a vacuum, higher device speeds/faster speeds of operation and larger current drives are also ensured by operation in the vacuum (e.g., due to the fact that the electrons are traveling in a vacuum). Further, in at least some embodiments, carbon morphologies are also susceptible to nano-engineering of their geometry, through growth and in situ modification, and offer the possibility of varying device characteristics individually, which is again not possible in conventional devices. Embodiments of the present invention, therefore, serve to solve the problem of flash memory scaling and can be implemented with currently used lithography and fabrication procedures.

The additional advantages include the possibilities of higher operating speeds and radiation tolerance. It is expected that the dual characteristics of tunneling and vacuum-based operation in at least some embodiments of the present invention will offer at least one possible solution to the problems of flash memory scaling that exist currently, and facilitate making nanotube-based electronics a reality.

Memory cells such as those described above (and other memory cells encompassed by the present invention) can be implemented in a variety of ways for a variety of purposes. Indeed, such memory cells can be implemented in combination with one another and/or other devices in a variety of ways, and various embodiments of the proposed invention have many potential applications. For example, referring to FIG. 6, the memory cell 2 of FIGS. 1-2 can be implemented in conjunction with certain other components/devices to create a NAND gate 130, and thus multiple such memory cells can be used to perform NAND gate logic.

As shown, the NAND gate 130 can be understood to include first and second sources S1 and S2, respectively, which correspond to the first and second cathodes T/12 and 44 of the memory cell 2 of FIGS. 1-2, respectively, and from which protrude the first and second CNTs 12 and 14, respectively. Additionally, the NAND gate 130 can be understood to include first and second gates G1 and G2, respectively, which respectively correspond to the first and second gates 46 and 50 of the memory cell 2, and first and second drains D1 and D2, respectively, which correspond to the first and second anodes F and 48 of the memory cell 2, respectively. Further as shown, the first source S1 and the second drain D2 of the NAND gate 130 in the present embodiment are coupled together by way of a resistor, which can be the resistor 42 (that is, the Write Line and Bit Line of the memory cell 2 of FIG. 1 are coupled to one another). Also, the first drain D1 and second source S2 are short circuited to one another (as are the anode F and cathode 44 of the memory cell 2 as shown in FIGS. 1-2). Finally, the second drain D2 corresponding to the Bit Line of FIGS. 1-2 is coupled to an external electron detector/scintillator or photomultiplier (PMT) tube 140.

Table 3 shows exemplary operation of the NAND gate 130. In the present embodiment, the first and second gates G1, G2 constitute the two input terminals of the NAND gate 130. As shown, when the first and second gates G1, G2 are both turned off, current flows from the first source S1 to the first drain D1, then to the second source S2, and finally to the second drain D2, such that a voltage drop is registered across the resistor 42. However, when either (or both) of the first and second gates G1, G2 is turned on, then current does not flow either from the first source S1 to the first drain D1, or from the second source S2 to the second drain D2, or both, such that the voltage drop is no longer registered across the resistor. Consequently, an output signal provided by the second drain D2 to the electron detector/scintillator or PMT tube 140 depends upon both of the signals provided to the first and second gates G1, G2, and more particularly varies in response to the signals provided to the first and second gates in accordance with NAND logic.

TABLE 3

| G1 | G2 | S1D2 | S2D1 |
|----|----|------|------|
| 1  | 1  | 0    | 0    |
| 1  | 0  | 0    | 0    |
| 0  | 1  | 0    | 0    |
| 0  | 0  | 1    | 1    |

The above demonstration that memory cells such as the memory cell 2 of FIGS. 1-2 can be operated as a NAND gate such as the NAND gate 130 of FIG. 6 is intended to further demonstrate that, given that NAND gates can be used to perform any arbitrary logic operation (NAND gates are known to be "Universal Logic Gates", and can be used to create any arbitrary logic gate such as, for example, NOR, OR, AND, XOR, etc.), so to the memory cells of the present invention are capable of performing any arbitrary logic operation. Additionally, it should be further understood that embodiments of the present invention are capable of being employed in a variety of information processing, communication and storage applications, including applications employing integrated logic and memory devices. Indeed, the present invention is intended to encompass not only a variety of different types of memory cells but also is intended to encompass a variety of devices, systems and methods of operation that employ such memory cells. For example, the present invention is intended to encompass computers, communication devices, and control devices that employ memory devices in accordance with embodiments of the present invention.

It should also be noted that at least some embodiments of the present invention can be used for constructing a memory that will be useful for nanoelectronics applications of the future. More particularly, at least some embodiments involve non-volatile memory with (a) reduced power, (b) higher packing density, (c) lower heat dissipation, (d) immunity to ionizing radiation, and can be employed in systems requiring such non-volatile memory. Alternatively, one can design a sensor system for active registration of the two substrates. In this scheme, the current from a nanotube field emitter on one substrate is sensed by an array of anodes on the other substrate akin to a four-quadrant detection scheme. Such a scheme is akin to a "four-quadrant" detector that is used for precise location/position detection, and is one example of a device (of many possible devices) that can be used to extend the accuracy of the flip chip alignment discussed above.

Although exemplary methods of operating and fabricating memory devices in accordance with at least some embodiments of the present invention have been described above, the present invention is further intended to encompass other methods of operating and fabricating memory devices as well. For example, the present invention is intended to encompass any operational methods that involve applying voltages to a memory cell in order to control the emission of electrons from a carbon nanotube or any other nanotube, nanowire, nanocone, or nanofiber. Also for example, the present invention is intended to encompass any methods of manufacturing memory devices that involve the formation of carbon or other nanotubes/nanowires/nanocones/nanofibers within memory cells or triodes.

It is specifically intended that the present invention not be limited to the embodiments and illustrations contained herein, but include modified forms of those embodiments including portions of the embodiments and combinations of elements of different embodiments as come within the scope of the following claims.

We claim:

1. A memory device comprising:
a memory cell that includes:
a first triode that includes a first nanostructure;
a second triode that includes a second nanostructure; and
a layer of metal that forms both an anode of the first triode and a cathode of the second triode;
wherein the first nanostructure and the second nanostructure are positioned within a vacuum-sealed region.

2. The memory device of claim 1, wherein the first nanostructure is a carbon nanostructure.

3. The memory device of claim 2, wherein the carbon nanostructure is a carbon nanotube (CNT).

4. The memory device of claim 1, wherein the memory device is a non-volatile memory device.

5. The memory device of claim 1, wherein the memory device is a flash memory device.

6. The memory device of claim 1, wherein the memory device is a random access memory (RAM) device.

7. The memory device of claim 1, wherein the memory device is a read only memory (ROM) device.

8. The memory device of claim 1, wherein the memory device is an alternating current (AC) type device.

9. The memory device of claim 1, wherein the memory cell includes first and second portions having first and second substrates, respectively, wherein the first and second nanostructures are fabricated on the first and second substrates, respectively, and wherein the first and second portions of the memory cell are arranged in relation to one another by way of a flip-chip operation.

10. The memory device of claim 9, wherein the first nanostructure serves as an erase tip.

11. A logic device comprising the memory device of claim 1.

12. A computer employing the logic device of claim 11, wherein the logic device is a NAND gate that can be used to form at least part of a further gate selected from the group consisting of an AND gate, a NOR gate, an OR gate, an XOR gate, or another type of logic gate.

13. The device of claim 1, wherein the first nanostructure comprises a nanotube, a nanowire, a nanocone, or a nanofiber and the second nanostructure comprises another nanotube, another nanowire, another nanocone, or another nanofiber.

14. The device of claim 1, wherein the layer of metal forms a plate of a storage capacitor.

* * * * *